(12) United States Patent
Watanabe

(10) Patent No.: US 6,470,103 B2
(45) Date of Patent: Oct. 22, 2002

(54) SEMICONDUCTOR PARTS AND SEMICONDUCTOR MOUNTING APPARATUS

(75) Inventor: Takayuki Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/984,408

(22) Filed: Oct. 30, 2001

(65) Prior Publication Data

US 2002/0020811 A1 Feb. 21, 2002

Related U.S. Application Data

(62) Division of application No. 09/259,690, filed on Mar. 1, 1999.

(30) Foreign Application Priority Data

Mar. 20, 1998 (JP) .......................................... 10-072483

(51) Int. Cl.$^7$ ................................................. G02B 6/12
(52) U.S. Cl. .......................................... 385/14; 385/52
(58) Field of Search ........................... 250/239; 385/14, 385/50, 52

(56) References Cited

U.S. PATENT DOCUMENTS 5,199,087 A * 3/1993 Frazier ......................... 385/14
5,499,732 A   3/1996 Nishimoto
5,864,642 A * 1/1999 Chun et al. .................... 385/14

FOREIGN PATENT DOCUMENTS

JP      6-347665     12/1994
JP      8-110446      4/1996

* cited by examiner

Primary Examiner—F. L. Evans
(74) Attorney, Agent, or Firm—Armstrong, Westerman & Hattori, LLP

(57) ABSTRACT

To provide a package structure for securing a satisfactory optical coupling between an optical device arranged beforehand on a printed board and an optical device newly mounted on the particular printed board. Positioning LDs 41a and 41b are arranged on a printed board 1. A sensing PD 42a for receiving the optical signal emitted from the positioning LD 41a and a sensing PD 42b for receiving the optical signal emitted from the positioning LD 41b are arranged in an OEIC package 11 mounted on the printed board.

3 Claims, 14 Drawing Sheets

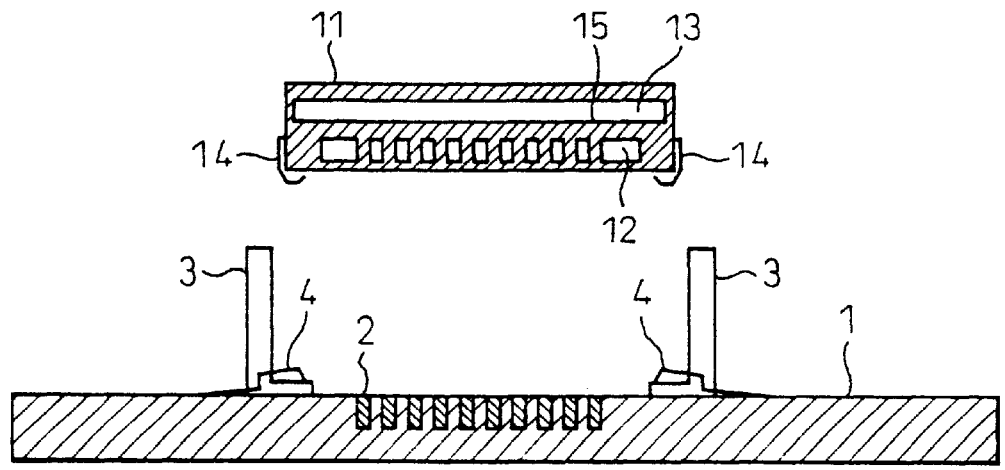
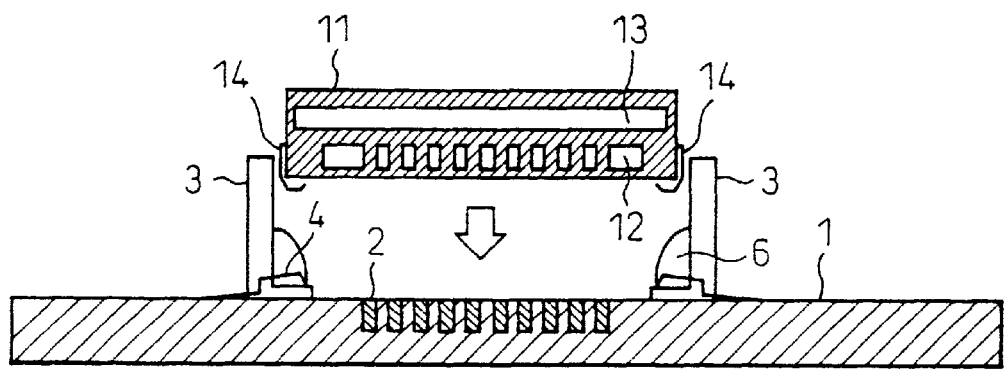
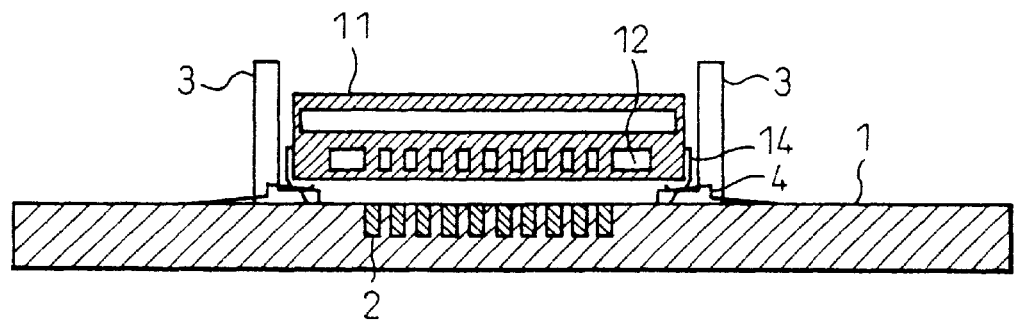

SEMICONDUCTOR PARTS AND SEMICONDUCTOR MOUNTING APPARATUS

This application is a division of prior application Ser. No. 09/259,690 filed Mar. 1, 1999.

BACKGROUND OF THE INVENTION

1. Field of the Invention

The present invention relates to a structure for interconnection between semiconductor chips, between MCMs (multichip modules) or between an MCM and a semiconductor chip packaged on a printed board, or more in particular to a structure for mounting a semiconductor or an MCM accurately at a predetermined position on the board in order to obtain a superior optical coupling between the parts and an optical waveguide for optical communication between the parts on the printed board.

2. Description of the Related Art

With an increase in signal transmission speed and an increased density of wirings and parts, the technique of electrically interconnecting parts on a printed board has posed the problem that an increased wiring resistance, due to the skin effect, appears and that crosstalk between wiring is caused during communication between the parts. The increased wiring resistance leads to an increased heat generation and the crosstalk disturbs the signal waveform causing a malfunction. In this way, electrical methods of interconnection have almost come to a limit of speed and density.

A method for solving the problem mentioned above is to secure an optical connection in which the parts packaged on a printed board communicate with each other using an optical signal.

FIG. 18 shows a structure for optical communication between the parts packaged on a printed board.

In FIG. 18a, 101 designates a printed board, 102 waveguides, 103 and 104 IC packages, 105 electrical circuit chips, 106 optical device arrays, 108 leads and 109 ball bumps.

The IC packages 103 and 104 each have built therein the electrical circuit chip 105 and the optical device array which is an assembly of light-emitting elements and photo-detectors. This packages is also called an OEIC package in view of the fact that electrical circuits and optical devices are integrated. Also, the optical device array 106 is electrically connected with the electrical circuit chips through the ball bumps 109. The printed board 101 has buried therein a plurality of the waveguides 102 corresponding to the elements of the optical device array for transmitting an optical signal exchanged between the parts arranged on the printed board. The leads 108 receive power from a power supply unit not shown and supply it to the electrical circuit chips 105 and the optical devices 106 in the IC packages.

FIG. 18b is a bottom view of the IC packages 103 and 104. In FIG. 18b, 112 designates radiation holes of the light-emitting elements of the optical device array or incidence holes of the photo-detectors.

The diameter of a radiation hole 112 and an incidence hole 112 is about 20 $\mu$m and the holes are arranged at intervals of about 100 $\mu$.

FIG. 18c is a top plan view of the printed board 101. In FIG. 18c, 121 designates pads and 122 openings of waveguides.

The pads 121 are supplied with power from a power supply unit not shown and connected with a power terminal or a GND terminal 108. The openings 122 of the waveguides are placed in opposed relation to the radiation holes or the incidence holes 112. The diameter of each opening 122 is about 50 $\mu$m to 90 $\mu$m, and the openings are arranged at intervals of about 100 micrometers.

With reference to FIGS. 18a to 18c, the optical communication between the IC package 103 and the IC package 104 will be explained. In this case, an optical signal is assumed to be sent from the IC package 103 to the IC package 104.

The IC packages 103 and 104 are supplied with power from a power supply unit not shown through the pads 121 and the leads 108.

The electrical circuit chip 105 of the package 103 outputs a signal (electrical signal) to the electrical circuit chip 105 of the package 103. The signal output from the electrical circuit chip 105 is converted into an optical signal in the light-emitting elements of the optical device array 106, and radiated toward the openings 122 of the waveguide from the radiation holes 112. The optical signal passes into the waveguides 102 from the openings 122, proceeds in the waveguides 102 and is output toward the incidence holes 112 of the IC package 104 from the openings 122 of the IC package 104. The optical signal received by the IC package 104 is converted into an electrical signal by the photo-detectors in the optical device array 106 and output to the electrical circuit chip 105.

The use of the above-mentioned technique of interconnection permits exchange of an optical signal between parts and eliminates the need of electrical connection, obviates the problems of increased wiring resistance and crosstalk, and thus can increase the signal transmission speed and the density of parts and wiring.

As shown in FIGS. 18b and 18c, however, the openings 122 and the radiation and incidence holes 112 of the waveguides are so small that the registration between the waveguides and the optical devices requires a highly accurate optical coupling technique. The registration error must be controlled to not more than 10 $\mu$m. Also, the LD (laser diode) used as the light-emitting element and the PD (photo-diode) used as the photo-detector have a low heat resistance, and are liable to be broken by a thermal stress when soldered for packaging.

SUMMARY OF THE INVENTION

The object of the present invention is intended, taking the above-mentioned problem into consideration, to provide a highly accurate technique for optical coupling between parts and a packaging technique exerting only a small stress on the optical devices in such an optical coupling.

In order to solve the above-mentioned problem, according to the invention, a socket for receiving a semiconductor part including photoelectric elements is arranged on a printed board. The position of packaging a semiconductor part on the printed board is defined, and therefore the accuracy of registry between the optical transmission path on the printed board and the optical device of the semiconductor part is improved.

Preferably, the socket includes a power terminal for supplying a source voltage to the photoelectric elements of the semiconductor part. Preferably, the change in the terminal shape of the part can be met simply by redesigning the socket, and therefore the multipurpose applicability of the printed board is maintained.

Preferably, the semiconductor part inserted into the socket and the insertion holes of the socket for the semiconductor part are placed in spaced relation to each other. As a result, the correct position of arrangement of the semiconductor part is held within a predefined range, resulting in an improved working efficiency.

Preferably, the semiconductor part packaged on the printed board includes light-emitting elements for transmitting an optical signal and photo-detectors for receiving the optical signal emitted by the light-emitting elements. The semiconductor part emits an optical signal, and receives the optical signal by itself through the optical device arranged on the printed board. The degree of optical coupling between the printed board and the semiconductor part can be determined.

Preferably, the optical device arranged on the printed board is specified as an optical transmission path. Unless both the light-emitting elements and the photo-detectors of the semiconductor part are optically coupled to the openings of the optical transmission path, the semiconductor elements cannot receive the optical signal emitted by themselves. In other words, the structure is such that the registration between two points of a semiconductor part and two points of the printed board can be achieved at the same time by receiving the optical signal.

Preferably, an optical device for optical communication with the photoelectric elements arranged on the printed board is included in the semiconductor part packaged on the printed board. The right packaging position of the semiconductor part on the printed board can be checked by optical communication between the printed board and the semiconductor part and verifying the degree of optical coupling.

Preferably, the semiconductor part includes a plurality of optical devices corresponding to the photoelectric elements, respectively, arranged on the printed board. A plurality of points of the semiconductor part and a plurality of points of the printed board can be registered with each other, and the semiconductor part can be defined to a single orientation.

Preferably, the semiconductor part includes an electrical circuit chip operated by the power supplied from an external source and photoelectric elements for exchanging the optical signal and the electrical signal between the electrical circuit chip and the optical device on the printed board. The optical communication is possible between a plurality of semiconductor parts packaged on the printed board. Therefore, the electrical wiring is eliminated, and the increased heat generation and crosstalk which otherwise might occur, due to the increased transmission rate and the increased density of the transmission path, can be suppressed.

Preferably, there is provided a printed board on which a semiconductor part including photoelectric elements is packaged, and an optical transmission path is arranged for returning the optical signal, emitted by the semiconductor part, to the same semiconductor part. The optical signal output from the semiconductor element is returned to the particular optical signal. Unless the photoelectric elements of the semiconductor part are optically coupled to both the inlet and outlet of the optical transmission path, however, the optical transmission path can neither receive nor output the optical signal. In other words, the structure is such that the registration between two points of the semiconductor part and two points of the printed board can be accomplished at the same time by the receipt of the optical signal.

Preferably, photoelectric elements are arranged a printed board for performing optical communication with an optical device included in a semiconductor part mounted on the printed board. Optical communication is conducted between the printed board and the semiconductor part, and the degree of optical coupling is verified, so that the correct packaging position of the semiconductor part on the printed board can be found.

Preferably, a plurality of photoelectric elements corresponding to the respective optical devices of the semiconductor part are arranged on the printed board. A plurality of points on the semiconductor parts can be registered with a plurality of points on the printed board, and the position of the semiconductor part is defined by a single orientation.

Preferably, there is provided a printed board on which a semiconductor part including light-emitting elements, photo-detectors and photoelectric elements is packaged. Further, an optical transmission path with an end thereof optically coupled to the light-emitting elements of the semiconductor part and with the other end thereof optically coupled to the photo-detectors is arranged on the printed board. The board has such a structure that the optical signal transmitted from the semiconductor part is returned to the semiconductor part through the optical transmission path arranged on the printed board. Superior optical coupling is achieved between two points of the printed board and two points of the semiconductor part, thereby guaranteeing the arrangement of the semiconductor elements at the correct position.

Preferably, there is provided a printed board unit in which a semiconductor part including an optical device is packaged on a board and further photoelectric elements optically coupled to the semiconductor part are arranged on the board. Optical communication be performed between the printed board and the semiconductor part thereby guaranteeing the optical coupling between the two.

Preferably, there is provided a printed board unit in which a semiconductor part including an optical device is fixed by an adhesive on the board. The semiconductor part is fixed on the printed board without stress, and therefore the durability is improved.

Preferably, there is provided a positioning apparatus in which a position where an optical signal can be received with high sensitivity is automatically searched for while moving a semiconductor element for optically communicating with the printed board.

Preferably, the positioning apparatus includes a power terminal for supplying power to the optical device of the semiconductor part. A part dedicated to registration need not be arranged on the printed board, and a reduction in density of the wiring and the parts on the printed board can be prevented.

Preferably, the positioning apparatus is such that the adhesive for fixing the semiconductor part on the printed board is set upon completion of the positioning operation. The semiconductor part is automatically fixed on the printed board.

Preferably, the semiconductor part including an optical device is fixed on the printed board using an adhesive. In other words, the soldering is eliminated, thereby solving the problem that the semiconductor part is broken by the high-temperature heat generated by the soldering process.

Preferably, the semiconductor part mounted on the printed board and is moved while optically communicating with the printed board, thereby checking the receiving sensitivity. Relative positions of two mutually distant objects can be checked, and the correct position of a semiconductor part on the printed board can be found.

BRIEF DESCRIPTION OF THE DRAWINGS

These and other objects of the present invention will become apparent from the following detailed description of the preferred embodiment of the invention, taken in connection with the accompanying drawings.

In the drawings:

FIGS. 1a, 1b, and 1c are views showing the process of mounting an OEIC package on a printed board;

DETAILED DESCRIPTION OF THE INVENTION

Figure 2A:
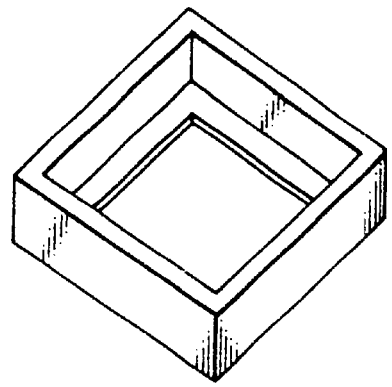
FIGS. 2a, 2b, 2c, 2d, and 2e are views showing a connector socket.

Embodiments of the present invention will be explained below.

FIGS. 1a to 1c are diagrams showing the process of mounting an OEIC package on a printed board. Sectional views of the printed board and the OEIC package mounted on the printed board are shown in each drawing.

In FIGS. 1a to 1c, 1 designates a printed board, 2 waveguides, 3 a connector socket, 4 power terminals or ground terminals, 6 an adhesive, 11 an OEIC package, 12 an optical device array, 13 an electrical circuit chip and 14 a package-side power terminal or ground terminal.

FIG. 1a shows the first step of mounting.

The OEIC package 11 has sealed therein the optical device array 12 and the electrical circuit chip 13, which are electrically connected to each other through ball bumps 15. The optical device array 12 has arranged thereon LDs (laser diodes) as light-emitting elements and PDs (photo-diodes) as photo-detectors. The electrical signal output from the electrical circuit chip 13 is modulated into an optical signal by the LDs, and the optical signal received by the PDs is demodulated into an electrical signal and applied to the electrical circuit chip 13.

The printed board 1 has buried therein the waveguides 2 corresponding to the elements of the optical device array, respectively, and the optical signal exchanged between the OEIC package 11 and other electronic parts mounted on the printed board 1 is transmitted through the waveguides 2. Each waveguide is an optical fiber made of glass or the like.

Also, the connector socket 3 is mounted on the printed board 1 and receives the OEIC package 11. The connector socket 3 includes a terminal 4 supplied with a source voltage and a ground voltage from a power supply unit not shown. The OEIC package 11 is also provided with a power terminal and a ground terminal 14, so that by contacting the terminals 4 on the connector socket side, the source voltage and the ground voltage are supplied to the optical device array 12 and the electrical circuit chip 13 in the OEIC package 11. The number of the terminals 4 and of the terminals 14 is not specifically determined. The terminals can be assigned for power and ground connection, respectively, or a plurality of terminals may be assigned for power or ground connection.

FIGS. 2a–2e show the connector socket. Each connector socket has a power supply terminal or a ground terminal 4, which will not be described here.

The connector socket 3 shown in FIG. 2a is made of a member having a square-framed flat surface and an L-shaped section.

Figure 2B:
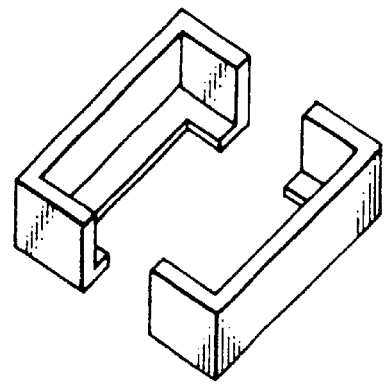

The connector socket 3 shown in FIG. 2b, on the other hand, includes a pair of members in opposed relation to each other each having a channel-shaped upper surface and an L-shaped section. The connector socket 3 shown in FIG. 2b is useful in the case where the terminal 14 of the OEIC package 11 is arranged only on a pair of the opposed sides of the OEIC package 11.

Figure 2C:
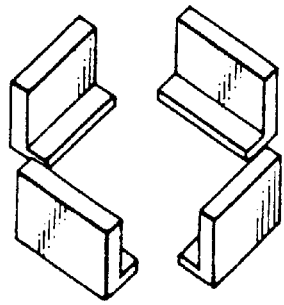

The connector socket 3 shown in FIG. 2c is comprised of members each arranged along each side of a rectangle and having a rod-shaped upper surface and an L-shaped section.

Figure 2D:
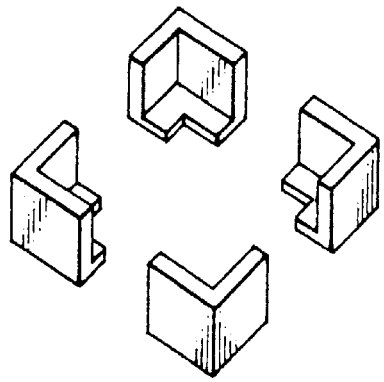

The connector socket 3 shown in FIG. 2d is comprised of members arranged in opposed relation to each other each and each having an L-shaped upper surface and an L-shaped section. The members are provided at least at a pair of corners of a rectangle. The OEIC package 11 received by the connector socket 3 shown in FIG. 2d is mounted on the printed board 1 with the corners thereof surrounded by the members of the connector socket 3.

Figure 2E:
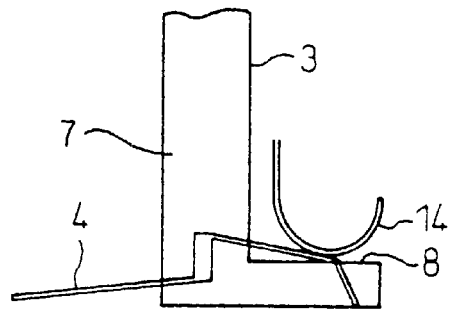
Figure 7:
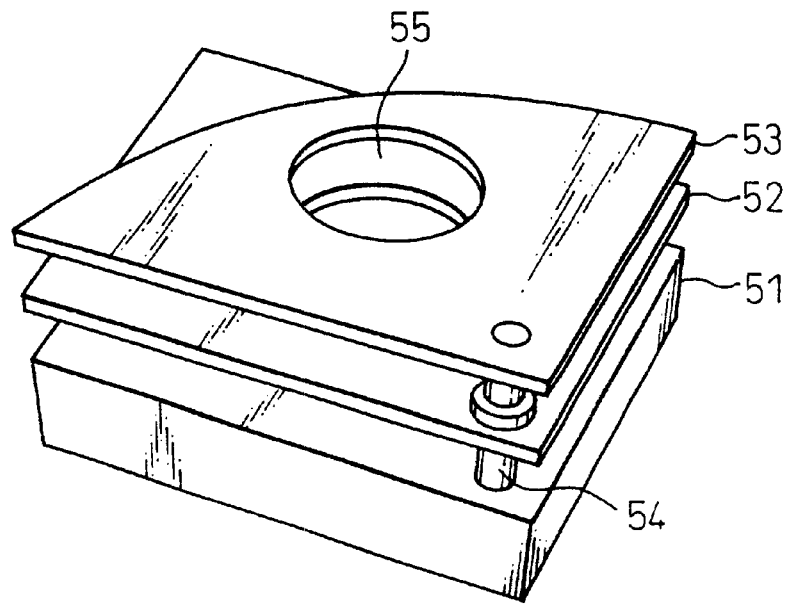
FIG. 7 is a diagram showing an adjust plate.

FIG. 2e is a sectional view of the connector sockets 3 shown in FIGS. 2a to 2d. In FIG. 2e, 7 designates an exterior wall, and 8 a base. The movable range of the OEIC package loaded into the connector socket 3 is limited by the exterior wall 7, and the terminal 14 is mounted on the base 8. The connector socket shown in each of FIGS. 2a to 2d has terminals 4 protruded from the inner surface of the exterior wall 7 and extending onto the base 8. Each terminal 14 of the OEIC 11 comes into contact with the terminal 4 located on the base 8. A maximum space of 100 μm is formed between the terminal 14 of the OEIC package and the outer wall 7 of the connector socket 3.

When the connector socket shown in any of FIGS. 2a to 2d is used, the terminals 14 of the OEIC package 11 are all mounted on the base 8 of the connector socket 3. However, the base 8 of the connector socket may be omitted and the terminals 4 can be arranged on the printed board 1. Such a connector socket is effective for receiving the OEIC package since the terminals 14 of the OEIC package are led out from the bottom surface but not from the side surfaces of the package.

FIG. 1b shows the second step of the mounting process. The OEIC package is loaded in an area defined by the connector socket 3. An adhesive 6 is coated in an area away from the terminals 14 on the inside of the outer wall 7 of the connector socket and on the base 8. A thermosetting resin or an ultraviolet light-setting resin is used as the adhesive.

FIG. 1c shows the third step of the mounting process. The OEIC package 11 is mounted on the printed board 1, so that the terminals 4 of the connector socket 3 and the terminals 15 of the OEIC 11 are brought into contact with each other and the waveguide 2 is set in registry with the elements of the optical device array 12.

Registration methods will be explained below.

With reference to FIGS. 3a–3d, a first registration method will be explained.

Figure 3A:
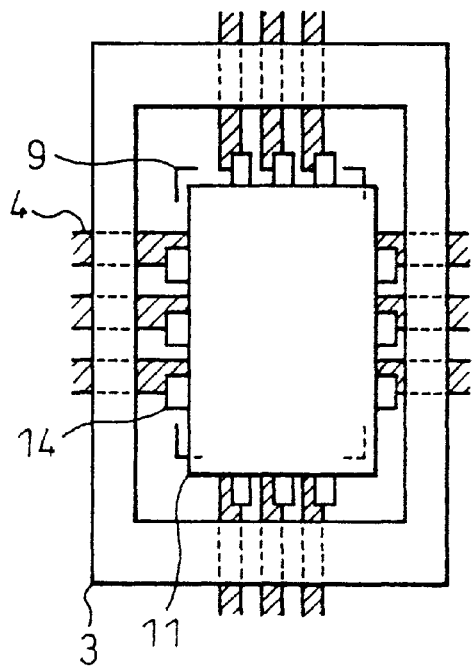
FIGS. 3a, 3b, 3c, and 3d are views showing a first method of registration.
Figure 3B:
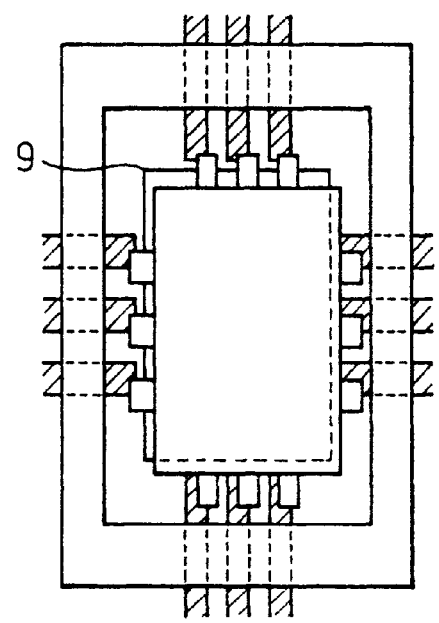

In FIGS. 3a–3d, a marking 9 is attached on the connector socket. The marking 9 and the edge of the OEIC package 11 are two-dimensionally overlapped, so that the elements of the optical device array 12 of the OEIC package are placed in opposed relation with the corresponding waveguides 2 thereby to achieve a superior optical coupling. FIGS. 3a to 3b all show that the OEIC package 11 is loaded into the connector socket 3 as viewed from the top. In this case, although the connector socket shown in FIG. 2a is used, the connector socket shown in any of FIGS. 2b to 2d can be used.

In FIG. 3a, a marking 9 is attached at each of four predetermined points on the base 8. Each marking 31 is hook-shaped. in the registration using the marking shown in FIG. 3a, each corner of the OEIC package 11 is two-dimensionally overlapped with the marking, so that the OEIC package is set in position. For setting the OEIC package 11 of FIG. 3a in position, the OEIC package 11 is moved left upward.

In FIG. 3a, although markings are attached at four points, respectively, a marking can be attached only at any one of the points. Desirably, however, markings are attached at least at two points.

In FIG. 3b, a frame-shaped marking is attached along the base 8 of the connector socket 3. When using the marking shown in FIG. 3b, the position of the OEIC package 11 is adjusted in such a manner that the peripheral edge of the OEIC package is overlapped with the marking.

Figure 3C:
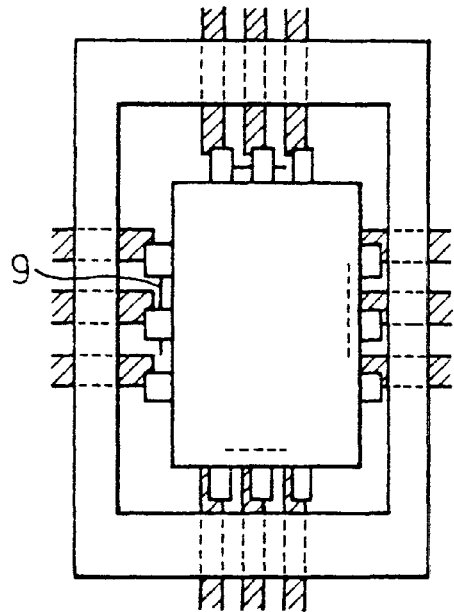

In FIG. 3c, a linear marking is attached on each side of the base 8 of the connector socket 3. When using the marking shown in FIG. 3c, the position of the OEIC package is adjusted by overlapping each marking with the corresponding side of the OEIC package. The markings, though attached on the four sides of the base 8, respectively, in FIG. 3c, may alternatively be attached only on two orthogonal sides.

Figure 3D:
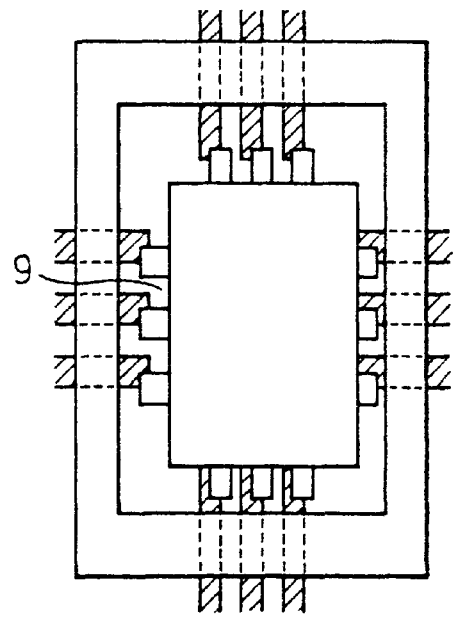

In FIG. 3d, spot markings are attached on the base 8 of the connector socket 3. Spot markings are required to be attached on at least a pair of orthogonal sides or at least at two corners of the base 8. When using the marking shown in FIG. 3d, the position of the OEIC package is adjusted in such a manner that all the spots are overlapped with the edge of the OEIC package 11 at the same time.

The markings shown in FIGS. 3a to 3e are all attached on the base 8 of the connector socket 3. When using a connector socket without a base, on the other hand, a marking is attached on the printed board in an area defined by the connector socket. Any shape shown in FIGS. 3a to 3d can be used for such a marking.

Also, a combination of the shapes can be used as a marking.

Figure 4:
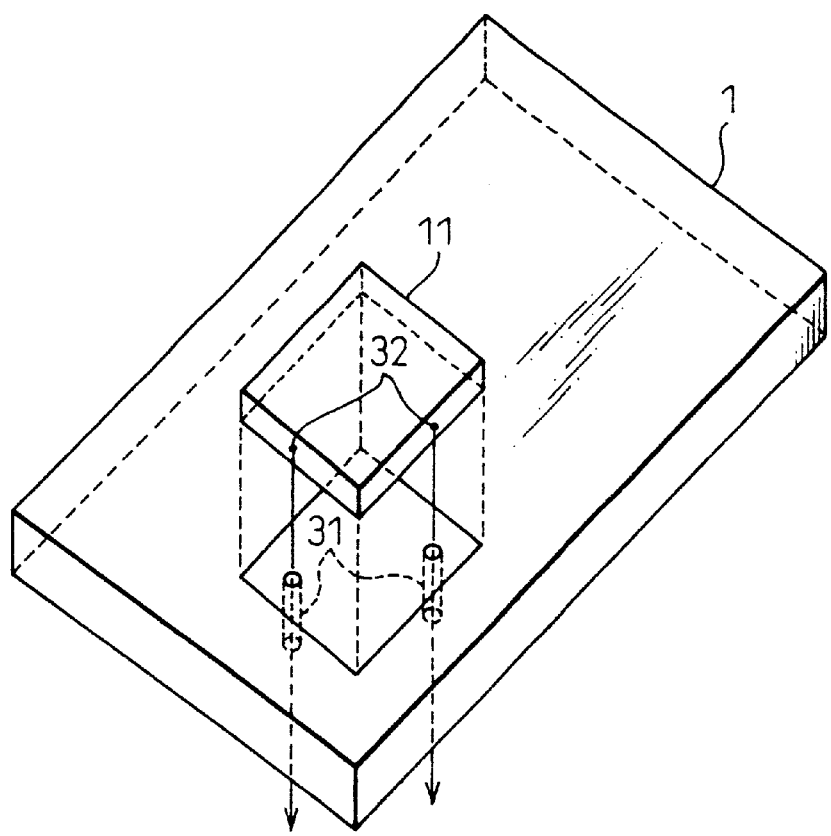
FIG. 4 is a diagram showing a second method of registration.

With reference to FIG. 4, a second registration method will be explained. As shown in FIG. 4, through holes 31 are formed at least at two predetermined positions in an area of the printed board 1 defined by the connector socket 3, and spot marks 32 corresponding to the respective through holes are attached on the back of the OEIC package 11.

In a second method of registration, the OEIC package 11 is moved in such a manner that all the spot marks 32 can be checked through the corresponding through holes 31 when the printed board 1 is viewed from the back. In the state where all the spot marks 32 and the through holes 31 are overlapped with each other, each element of the optical device array 12 of the OEIC package 11 is in opposed relation to a corresponding to waveguide 2, and a superior optical coupling is attained.

The matching between the through holes 31 and the spot marks 32 can be checked also by a method, other than direct viewing as in the above-mentioned example. For example, the picture is taken of the back of the printed board 1 with camera, and the image picked up by the camera is displayed in a display unit while the OEIC package 11 is moved to search for the position where the through holes 31 are overlapped with the spot marks 32.

Also, the through holes is not necessarily a circle, but may be a triangle, a rectangle or an other polygon or an ellipse. The marks of the OEIC package 11 are also not necessarily spots, but can be changed in shape in accordance with the shape of the through holes.

Further, although the through holes 31 are formed on the printed board 1 and the marks 32 are formed on the OEIC package 11 in the example described above, the through holes 31 can be formed on the OEIC package 11 and the marks 32 can be formed on the packaged surface of the printed board 1.

Figure 5:
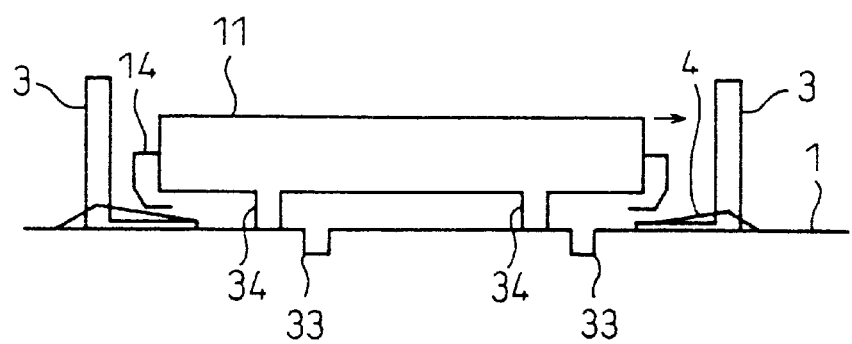
FIG. 5 is a diagram showing a third method of registration.

With reference to FIG. 5, a third method of registration will be explained. As shown in FIG. 5, recesses are formed at least at two points on the printed board 1, and protrusions 34 are formed on the surface of the OEIC package 11 facing the printed board (the back of the OEIC package 11)

In the third method of registration, the OEIC package 11 is moved in the direction in which the protrusions 34 are overlapped with the corresponding recesses 33 on the printed board 1, and the registration is completed when all the protrusions are fitted in the corresponding recesses.

In the examples described above, the recesses 33 are formed in the printed board 33 and the protrusions 34 are formed on the OEIC package. Instead, the protrusions 34 can be formed on the package surface of the printed board while the recesses 33 can be formed on the back of the OEIC package.

Also, the recesses are preferably formed apart from each other, and so are the protrusions. Especially, it is desirable to form them at opposed corners of rectangles.

With reference to FIGS. 6a–6d, a fourth method of registration will be explained. In the fourth method of registration, an accurate position of arrangement of the OEIC package 11 is detected by use of an optical sensor.

Figure 6A:
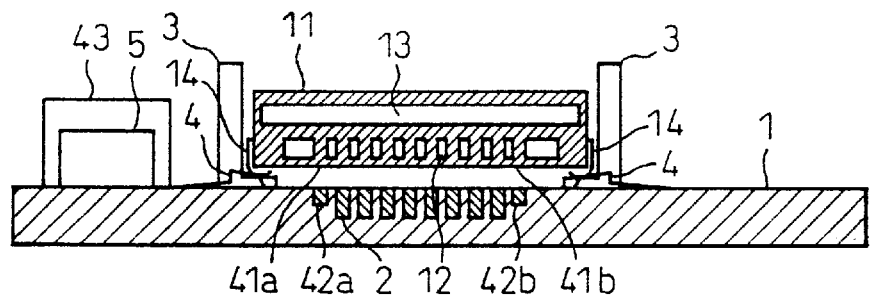
FIGS. 6a, 6b, 6c, and 6d are views showing a fourth method of registration.

In FIG. 6a, numerals 41a and 41b designate positioning LDs, numeral 42a and 42b sensing PDs, numeral 5 a power unit, and numeral 43 a monitor unit.

The positioning LDs 41a and 41b are arranged in the optical device array 12 of the OEIC package 11 and output an optical signal for registration. The sensing PDs 42a and 42b are both embedded in the printed board 1 for receiving the optical signals output from the positioning LDs 41a, 41b and converting them into electrical signals, respectively. The PD can be replaced by a photo-transistor. The positioning LDs 41a and 41b are supplied with a source voltage from the power unit 5 through the terminals 4 arranged on the connector sockets 3 and the terminals 14 arranged on the OEIC package 11. The sensing PDs 42a and 42b are supplied with a source voltage from the power unit 5 through a predetermined layer of the printed board. The monitor unit 43 monitors the electrical signals output from the sensing PDs 42a, 42b. The output signals of the sensing PDs 42a, 42b are received by the monitor unit 43 through a predetermined layer in the printed board.

The positioning LDs 41a, 41b output an optical signal toward the package surface of the printed board 1. Unless the OEIC package 11 is placed in position, the optical signals output from the positioning LDs are not received by the sensing PDs arranged on the printed board 1. The registration between the terminals 4 and the terminals 41 has a wide tolerance. Even when the OEIC package 11 is not placed in position but as long as it is located within the connector socket, the connection is maintained between the terminals 4 and 41, and power continues to be supplied to the positioning LDs.

In order to set the OEIC package 11 in position, the first step of operation is to secure the optical coupling between the positioning LD 41a and the sensing PD 42a. A method for this will be explained below.

The OEIC package 11 is arranged at a predetermined position (X0, Y0) on the X-Y coordinate defined on the printed board. The coordinate on the printed board is stored in a robot, which moves the OEIC package to the point (X0, Y0). The worker moves the OEIC package 11 according to the steps described in 1 to 4 below and searches for the coordinate point (Xj, Yj) where the maximum output can be produced from the sensing PD 42a.

1. While maintaining a constant Y coordinate, the OEIC package 11 is moved in parallel to X axis to the farthest end in the movable range. Assume that the X coordinate of the farthest point is Xmax. The moving distance to Xmax is about 100 μm.

2. While keeping the X coordinate at Xmax, the OEIC package 11 is moved in parallel to the Y axis by a very small distance Y1. Y1 is about 100 μm.

3. While maintaining the Y coordinate constant, the OEIC package 11 is moved in parallel to the X axis until the coordinate X0 is reached along the X axis.

4. While maintaining the X coordinate at X0, the OEIC package 11 is moved by a very small distance Y1 in parallel to the Y axis.

The OEIC package, when moved according to 1 to 4 above, moves to the coordinate point (Xmax, Ymax). Ymax is the farthest end point in the movable range. The distance to Ymax is about 100 μm.

While the OEIC package 11 is moving, the output level of the sensing PD 42a is monitored by the monitor unit 43. The monitor unit 43, upon detection that a signal exceeding a preset level is output from the sensing PD 42a, outputs a positioning-over signal and gives an instruction to stop the movement of the OEIC package 11 visibly or audibly.

Upon complete registration between the positioning LD 41a and the sensing PD 42a, the operation is performed to secure optical coupling between the positioning LD 41b and the sensing PD 42b. The manner in which such optical coupling is secured will be described below.

The OEIC package 11 located at the coordinate point (Xj, Yj) is rotated according to the steps described in 5 and 6 below, and a coordinate point is found where the maximaum output is produced from the sensing PD 42b.

5. With the coordinate point (Xp, Yp) of the sensing PD 42a as a rotational axis, the OEIC package 11 is rotated by θ1 in counterclockwise direction.

6. With the coordinate point (Xp, Yp) of the sensing PD 42a as a rotational axis, the OEIC package 11 is rotated by θ1+θ2 in clockwise direction.

In the foregoing description, θ1 and θ2 are the maximum movable angle in each direction of rotation and assume a value within the range of one to two degrees.

While the OEIC package 11 is moving, the output level of the sensing PD 42b is monitored by the monitor unit 43. The monitor unit 43, upon detection that a signal exceeding a preset level is output from the sensing PD 42b, outputs a positioning-over signal and gives a visible or audible instruction to stop the rotation of the OEIC package 11.

According to the steps 1 to 6 described above, the positioning LDs 41a and 41b are set in registry with the sensing LDs 42a and 42b, respectively, and the orientation of the OEIC package 11 is defined. At the same time, the elements constituting the optical device array 12 are optically coupled with the corresponding waveguides 2 of the printed board 1. After complete registry, the adhesive 6 is set to fix the OEIC package 11 on the printed board 1.

Figure 6B:
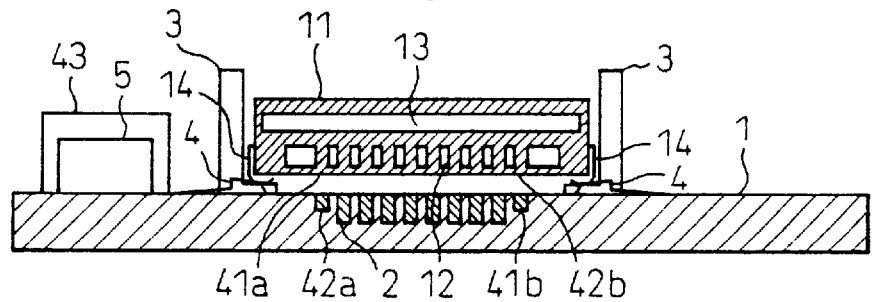
Figure 6C:
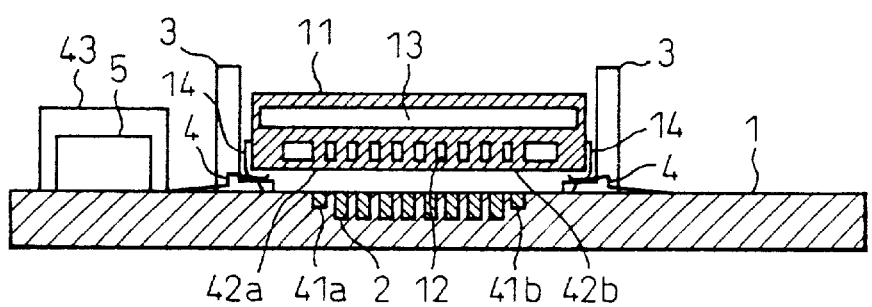

In the example shown in FIG. 6a, the positioning LDs 41a and 41b are both arranged on the OEIC package 11, while the sensing PDs 42a and 42b are both arranged on the printed board 1. Alternatively, as shown in FIG. 6b, one of the positioning LDs may be arranged on the printed board 1 and one of the sensing PDs may be arranged on the OEIC package 11. Also, as shown in FIG. 6c, the positioning LDs 41a and 41b may be both arranged on the printed board 1, while the sensing PDs 42a and 42b may be both arranged on the OEIC package 11 with equal effect. The electrical signals output from the sensing PDs arranged on the OEIC package 11 are applied to the monitor unit 43 through the terminals 14 and 4.

In the examples shown in FIGS. 6a to 6c, at least two pairs of the positioning LDs and the sensing PDs are required. Nevertheless, an explanation will be given below of a positioning method using one pair of a positioning LD and a sensing PD.

Figure 6D:
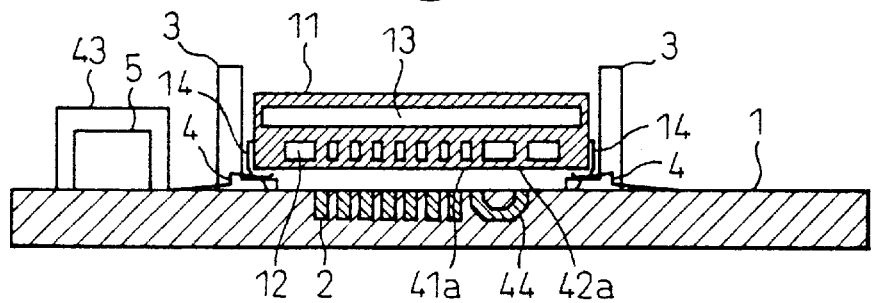

In FIG. 6d, the positioning LD 41a and the sensing PD 42a are both arranged in the OEIC package 11. A return waveguide 44 for returning the optical signal emitted from the positioning LD 41a to the sensing PD 42a is buried in the printed board 1. The positioning LD 41a and the sensing PD 42a are both supplied with power from the power unit 5 through the terminals 4 and 14. The electrical signal output from the sensing PD 42a is similarly output to the monitor unit 43 through the terminals 15 and 4.

In order to arrange the OEIC package 11 in position, the operation is performed for optically coupling the positioning LD 41a and the sensing PD 42a. The process of this operation will be described below.

The OEIC package 11 is arranged at a predetermined position (X0, Y0) on the X-Y coordinate defined on the printed board. The coordinates on the printed board are stored in a robot for conveying the OEIC package to the point (X0, Y0). The worker moves the OEIC package 11 according to the steps described in 7 to 11 below thereby to search for a coordinate that can produce a maximum output from the sensing PD 42a.

7. While maintaining a constant Y coordinate, the OEIC package 11 is inched by a minute distance each time in parallel to X axis to the farthest end point in the movable range. Assume that the X coordinate at the farthest end point is Xmax. The moving distance the distance to Xmax is about 100 μm.

8. While maintaining the X coordinate at Xmax, the OEIC package 11 is inched each time in parallel to the Y axis and moved by a distance Y1. Y1 is a distance of about 10 μm.

9. While maintaining a constant Y coordinate, the OEIC package 11 is inched by a minute distance each time in parallel to X axis until the coordinate X0 along the X axis is reached.

10. While maintaining the X coordinate at X0, the OEIC package 11 is inched in parallel to the Y axis each time by a minute distance Ys until it covers Y1.

11. In each step of 7 to 10 above, each time the OEIC package 11 is inched by Xs or Ys, it is rotated by ±θ about the X-Y coordinates at the outlet and the inlet of the return waveguide 44.

While the OEIC package 11 is being moved, the output level of the sensing PD 42a is monitored by the monitor unit 43. The monitor unit 43, upon detection that a signal exceeding a preset level is output from the sensing PD 42a, outputs a positioning-over signal, and gives an optical or aural instruction to stop the movement of the OEIC package 11.

FIGS. 7 to 11 show component parts for moving the OEIC package 11 as described with reference to steps 1 to 6 and 7 to 11, respectively.

FIG. 7 discloses members for holding the OEIC package and members for moving the same.

In FIG. 7, numeral 51 designates an OEIC holder, 52 an X-Y coordinate adjust plate, 53 a rotation adjust plate, 54 a rotation pole and 55 an inlet.

The OEIC holder 51 has a recess and holds therein the OEIC package 11. The X-Y coordinate adjust plate 52 moves the OEIC holder 51 in the X and Y directions. The rotation adjust plate 53 rotates the OEIC holder 5 about the rotation pole 54. The inlet 55 has inserted therein a duct for sucking the OEIC package. The OEIC package thus sucked is attracted to the OEIC holder 61 and fixed in orientation.

The OEIC holder 51, the X-Y coordinate adjust plate 52 and the rotation adjust plate 53 described above are integrated with each other through the rotation pole 54. Among these members, the OEIC holder 51 and the rotation adjust plate 53 are fixed to the rotation pole 54, and with the rotation of the rotation adjust plate 53, the OEIC holder 51 also rotates. The X-Y coordinate adjust plate 52 is rotatably mounted on the rotation pole and is not operatively interlocked with the rotation of the rotation adjust plate 53. When the X-Y coordinate adjust plate 52 moves along the X or Y axis, the other members (the rotation pole 54, the OEIC holder 51 and the rotation adjust plate 53) also move in the same direction.

Figure 8:
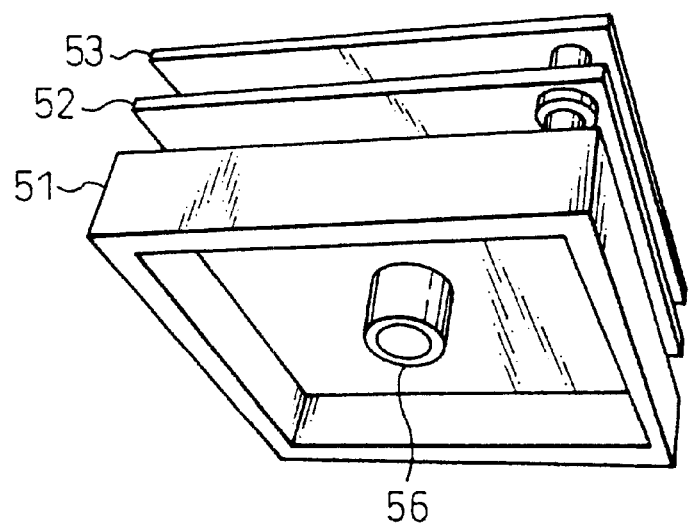
FIG. 8 is a diagram showing the lower part of an adjust plate.

FIG. 8 is a diagram showing the members of FIG. 7 as viewed diagonally from the bottom thereof. Numeral 56 designates a suction port to which the OEIC package held in the OEIC holder 51 is adsorbed.

Figure 9:
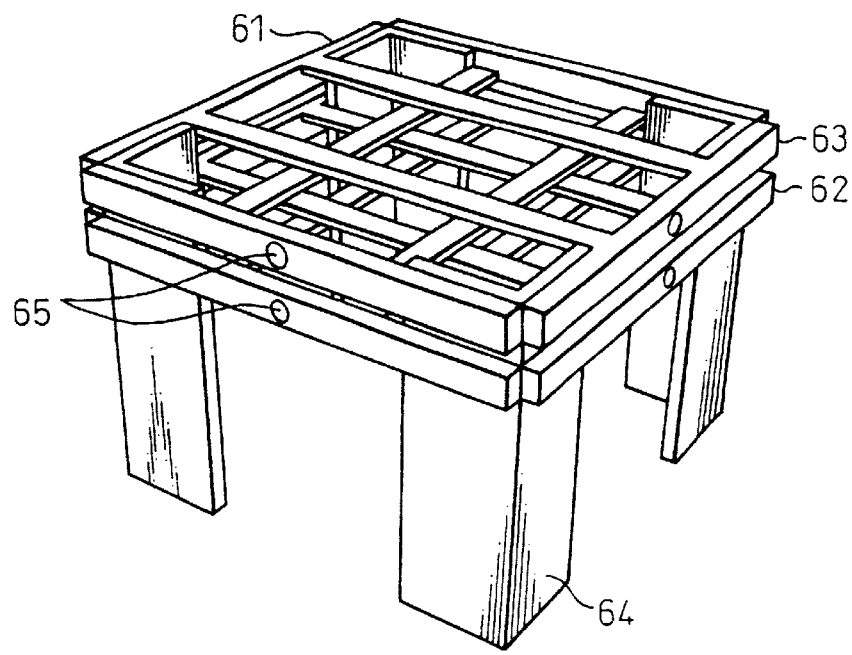
FIG. 9 is a diagram showing a plate supporting frame.

FIG. 9 shows a plate supporting frame 61 for supporting the members shown in FIGS. 7 and 8.

In FIG. 9, numeral 62 designates a first stage, 63 a second stage, 64 legs for supporting the first stage 62 and the second stage 63, and 65 pin holes.

The first stage 62 has mounted thereon the X-Y coordinate adjust plate 52. The second stage 63 is arranged on the upper layer of the first stage 62 and has mounted thereon the rotation adjust plate 53. The legs 64 sandwich the connector sockets 3 so that the whole supporting frame is fixed on the printed board 1. The pin holes 65 have inserted therein adjust pins for moving the X-Y coordinate adjust plate 52 and the rotation adjust plate 53. The pin holes 65 are formed in the four sides of the first stage 62 and two orthogonal sides 2 of the second stage 63. The supporting frame 61 shown in FIG. 12 with the plates mounted thereon is placed on the printed board 1. When the supporting frame 61 is placed on the printed board 1 with the connector sockets 3 held by the legs 64, the sensing PD 42a of FIG. 6a and the positioning LD 41a of FIGS. 6b and 6c are located just under the rotation pole 54, and the OEIC package 11 can be rotated about a point (Xp, Yp).

Figure 10:
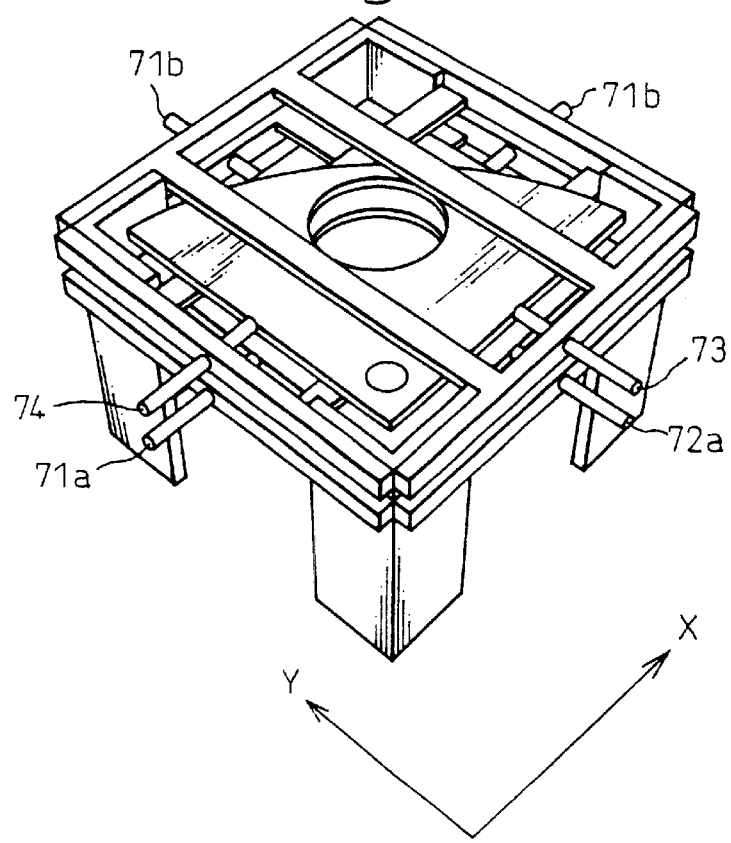
FIG. 10 is diagram showing the manner in which the adjust plate is stored in the plate supporting frame.

FIG. 10 shows the state in which the adjust plates shown in FIG. 7 are mounted on the plate supporting frame 61.

In FIG. 10, 71a designates an X-direction adjust pin, 71b an X-direction urge pin, 72a a Y-direction adjust pin, 72b a Y-direction urge pin, 73 a counterclockwise adjust pin, and 74 a clockwise adjust pin.

The X-direction adjust pin 71a moves along the X axis by the distance corresponding to the rotation amount thereby to move the X-Y coordinate adjust plate 51 along the X axis. The X-direction urge pin 71b is arranged in opposed relation to the X-direction adjust pin 71a and is urged toward the X-direction adjust pin 71a by spring or the like. The Y-direction adjust pin 72a moves along the Y axis by the distance corresponding to the rotation amount, and moves the X-Y coordinate adjust plate 52 along the Y axis. The Y-direction urge pin 72b is arranged in opposed relation to the Y-direction adjust pin 72a, and is urged toward the Y-direction adjust pin 72a by spring or the like. The counterclockwise adjust pin 73 moves along the Y axis by the distance corresponding to the rotation amount and rotates the rotation adjust plate 53 counterclockwise. The clockwise adjust pin 74, on the other hand, moves along the X axis by the distance corresponding to the rotation amount and rotates the rotation adjust plate 53 clockwise.

With the configuration shown in FIG. 10, the X-Y coordinate adjust plate 52 is held between an adjust pin and an urge pin and thus fixed in orientation. The rotation adjust plate 53, on the other hand, is fixed in orientation by being held between the counterclockwise adjust pin 73 and the clockwise adjust pin 74.

Figure 11:
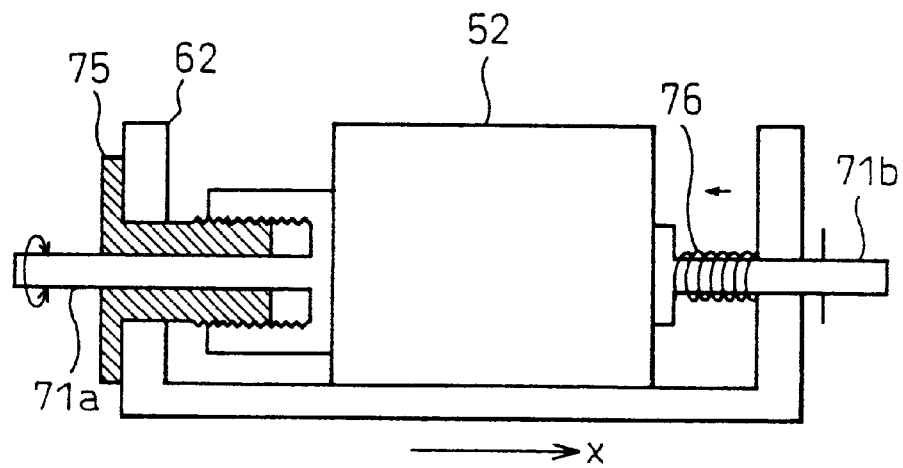
FIG. 11 is a diagram showing the structure of an adjustment screw.

FIG. 11 shows the structure of an adjust pin and an urge pin. The structure of the X-direction adjust pin 71a and the X-direction urge pin 71b will be explained as a typical adjust pin and a typical urge pin, respectively, of the adjust pins shown in FIG. 10. In the drawing, 75 designates a reference socket, and 76 a coil spring.

The reference socket 75 is laid through the outer frame of the first stage 62 and the forward end thereof reaches an area defined by an outer frame. The surface at the forward end portion of the reference socket 75 is formed with threads. The adjust pin 71a has a recess around the rotational axis at the forward end thereof for receiving the reference socket 75 and formed with threads to engage the threads of the reference socket 75. The adjust pin 71a is moved along the X axis by rotating around the reference socket 75. The urge pin 71b is laid through the outer frame of the first stage 71 and the forward end thereof reaches an area defined by the outer frame. A spring 76 is wound around the forward end of the urge pin 71b and held between the outer frame and the pin top. The spring 76 is extensible along the X axis thereby to urge the pin 71b toward the adjust pin 71b. The X-Y coordinate adjust plate 52 is held between the adjust pin 71a and the urge pin 71b. The adjust pin 71a, a by rotating in clockwise direction, moves toward the urge pin 71b thereby to move the X-Y coordinate adjust plate 52 in +X direction. On the other hand, the adjust pin 71a, by rotating in counterclockwise direction, moves in the direction opposite to the urge pin 71b. The X-Y coordinate adjust plate 52 thus pushed in the -X direction by the urge pin. The OEIC holder 51 is operatively interlocked with the X-Y coordinate adjust plate 52 and therefore moves in the same direction as the X-Y coordinate adjust plate 52. As a result, the OEIC package 11 held in the OEIC holder 51 is also moved.

An explanation will be given of a positioning unit for automatically adjusting the position of the OEIC package 11.

Figure 12:
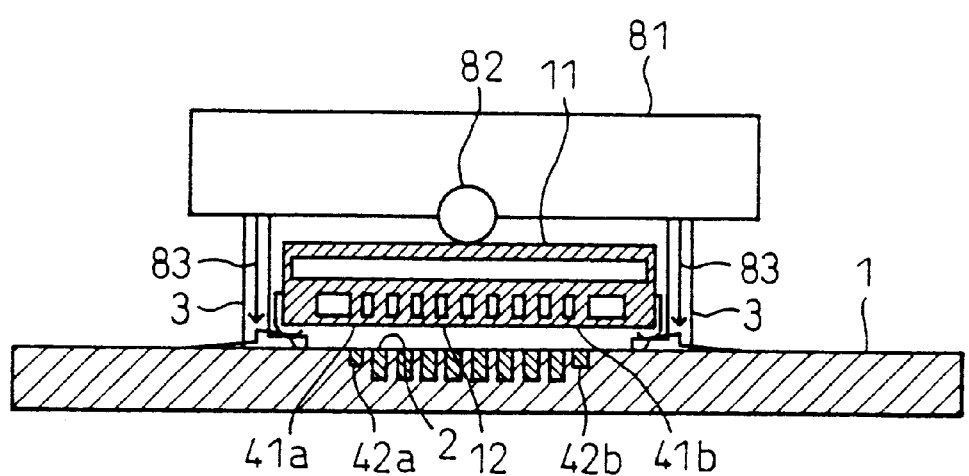
FIG. 12 is a diagram showing a positioning unit.

FIG. 12 shows a positioning unit used according to this embodiment.

In FIG. 12, numeral 81 designates a positioning unit, 82 a rotating ball, and 83 a power terminal or a ground terminal.

The positioning unit 81 is placed on the connector socket 3. The rotating ball 82 is rotated in contact with the upper surface of the OEIC package 11 thereby to move the OEIC package 11. A plurality of the terminals 83 are provided and inserted into the connector sockets 3. These terminals come into contact with the corresponding terminals 4, respectively, to supply a source voltage and a ground voltage to the positioning LDs and the sensing PDs in the OEIC package 11. Also, a source voltage is supplied from the terminals 83 of the positioning unit to the positioning LDs 41 and the sensing PDs 42 buried in the printed board. Further, the electrical signal output from the sensing PDs is supplied to the positioning unit 81 through the terminals 83. The positioning unit 81 detects the output of the sensing PDs and according to the intensity thereof, controls the rotation of the rotating ball 82. The positioning unit 81, upon detection that the OEIC package 11 is arranged in position, discharges hot air (in the case where the adhesive 6 is a thermosetting resin) or ultraviolet light (in the case where the adhesive 6 is an ultraviolet light-setting resin) toward the printed board 1 and thereby sets the adhesive 6.

Figure 13A:
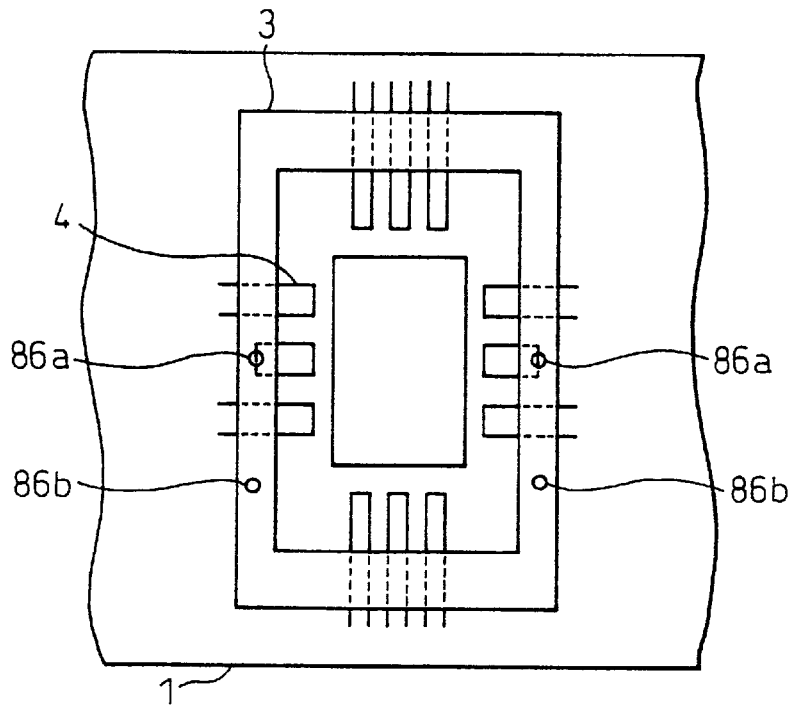
FIGS. 13a, 13b, and 13c are views showing the structure of a connector socket.
Figure 13B:
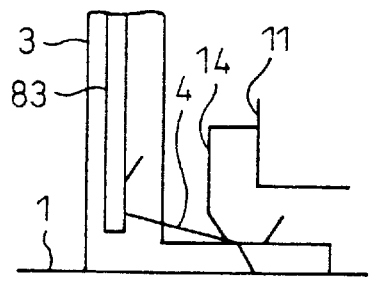
Figure 13C:
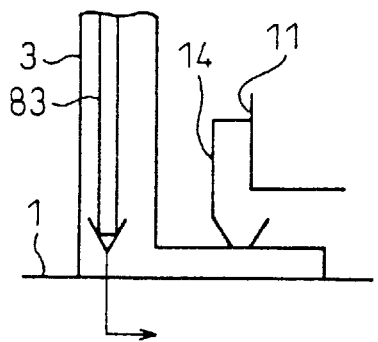

FIGS. 13a–13c show the structure of the connector socket 3 of FIG. 12.

In FIG. 13a, numerals 86a and 86b designate insertion holes of the terminals 83. The insertion holes 86a have inserted therein the terminals 83 conducting with the positioning LDs or the sensing PDs in the OEIC package 11. The insertion holes 86b, on the other hand, have inserted therein the terminals 83 conducting with the positioning LDs or the sensing PDs buried in the printed board. FIG. 13b shows the structure for securing the conduction between a terminal 83 and a terminal 14 of the OEIC package, and FIG. 13c shows a structure for securing the conduction between a terminal 83 and an element buried in the printed board 1.

Figure 14A:
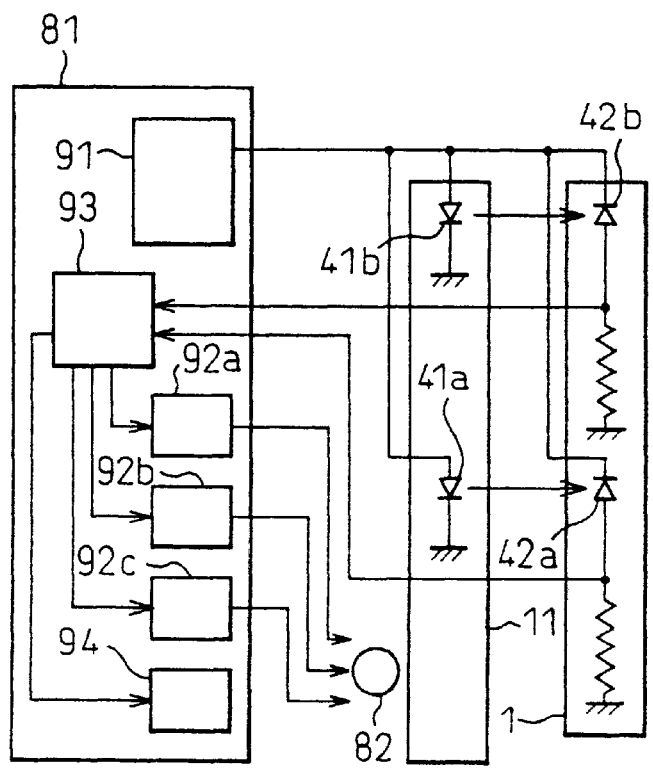
FIGS. 14a and 14b are views showing a function block diagram of a positioning unit.
Figure 14B:
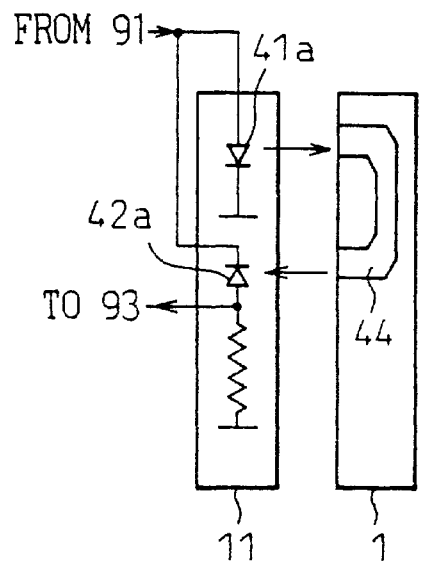

FIGS. 14a and 14b show an internal function block diagram of the positioning unit. In FIGS. 14a and 14b, numeral 91 designates a power supply unit, 92a, 92b, 92c motors, 93 a control circuit and 94 a discharge section.

The power supply unit 91 supplies a source voltage and a ground voltage to the positioning LDs and the sensing PDs of the OEIC package 11 through the terminals 83. The motors 92a, 92b, 92c drive the rotating ball 82 along X axis, Y axis and in the X-Y plane in the direction of angle θ. The control circuit 93 detects the output of the sensing PDs received from the terminals 83, and according to the intensity thereof, controls the drive of the motors. The discharge section 94 discharges toward the printed board the hot air (in the case where the adhesive 6 is a thermosetting resin) for setting the adhesive 6 for fixing the OEIC package 11 or the ultraviolet light (in the case where the adhesive 6 is an ultraviolet light-setting resin). FIG. 14a takes the registration between the OEIC package and the printed board shown in FIG. 6a into consideration, and FIG. 14b takes the registration between the OEIC package and the printed board shown in FIG. 6d into consideration. When the registration between the OEIC package and the printed board shown in FIG. 6b or FIG. 6c is taken into consideration, on the other hand, the positions of the positioning LDs and the sensing PDs shown in FIG. 14a are exchanged with each other.

Now, a method of adjusting the position where the OEIC package is arranged will be explained with reference to the positioning unit 81 shown in FIG. 12.

First, the registration between the OEIC package and the printed board shown in FIGS. 6a to 6c will be explained.

The OEIC package 11 is arranged at a predetermined position (X0, Y0) on the X-Y coordinate defined on the printed board. Each coordinate on the printed board is stored in a robot not shown, which robot conveys the OEIC package 11 to point (X0, Y0). Once the OEIC package is placed at point (X0, Y0), the positioning unit 51 is mounted on the printed board 1. The positioning unit 51 moves the OEIC package according to the steps described in 12 to 18 and searches for a coordinate point (Xj, Yj) where the maximum output is produced from the sensing PD 42a.

Figure 15:
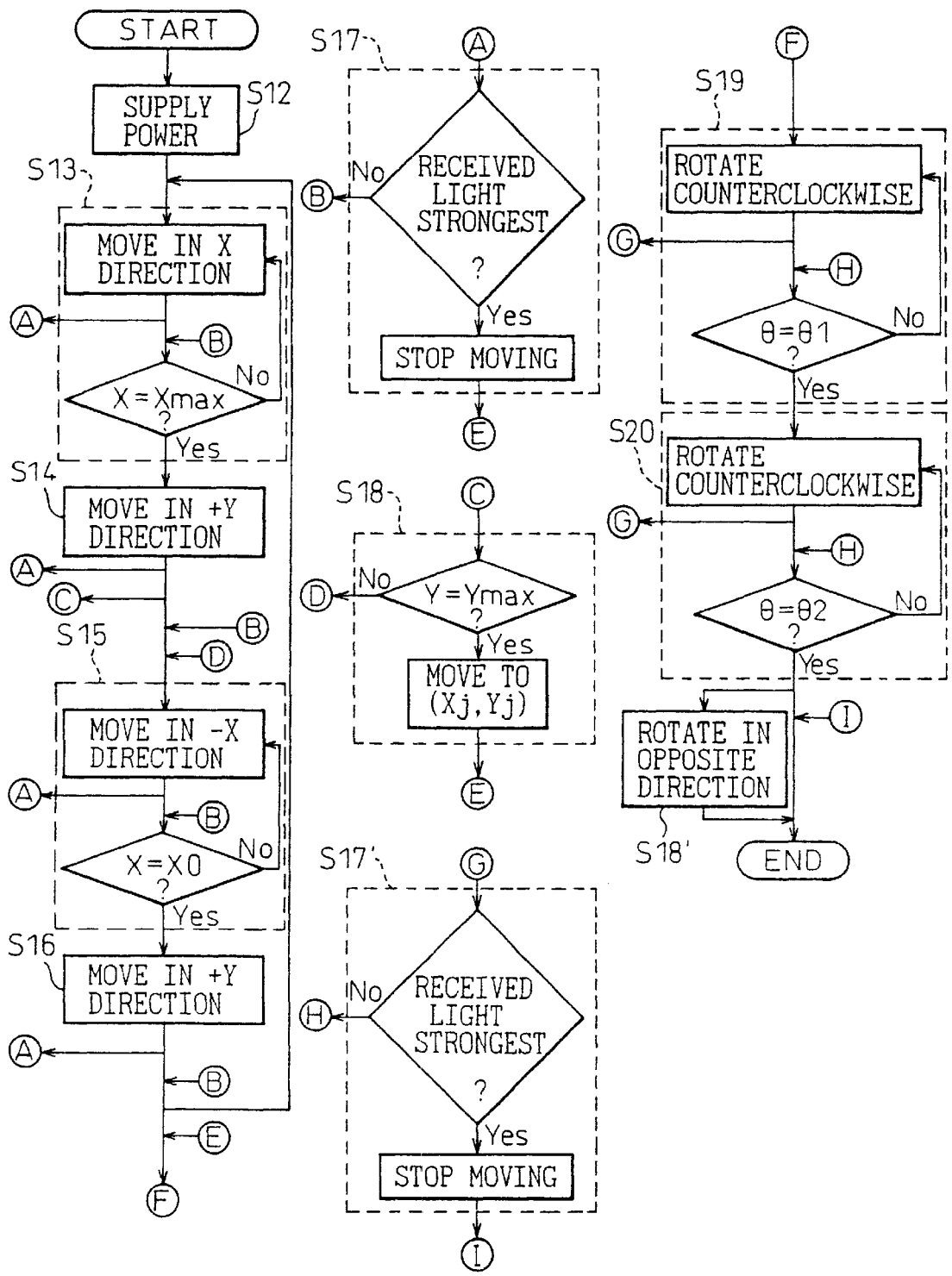
FIG. 15 is a first flowchart for registration.

FIG. 15 is a control flowchart for the positioning unit 81. Steps S12 to S17 shown in FIG. 15 will be explained below.

S12: The power supply unit 91 supplies power to the positioning LDs, the sensing PDs and the function blocks in the positioning unit 81.

S13: The control unit 93 drives only the motor 92a and moves the OEIC package 11 in parallel to X axis to the farthest end point in the movable range. Assume that the X coordinate of the farthest end point is Xmax. The control circuit 93 stores the rotational speed of the motor required for moving the OEIC package to Xmax. The distance to Xmax is about 100 μm.

S14: The control circuit 93 drives only the motor 92b and moves the OEIC package 11 in parallel to Y axis by a minute distance Y1. Y1 is about 10 μm. The control circuit 93 stores the rotational speed of the motor required for moving the OEIC package by Y1.

S15: The control circuit 93 drives only the motor 82a, and moves the OEIC package 11 in the direction parallel to X axis until the coordinate along X axis reaches X0.

S16: The control circuit 93 drives only the motor 92b, and moves the OEIC package 11 in the direction along Y axis by a minute distance Y1.

The OEIC package, when driven according to Steps S12 to S16 described above, moves to the coordinate (Xmax, Ymax). Ymax is the farthest end coordinate in the movable range along Y axis. The distance to Ymax is about 100 μm.

S17: While the OEIC package 11 is moving, the output level of the sensing PD 42a is monitored by the control circuit 93. The control circuit 93, upon detection of the fact that a signal exceeding a preset level is output from the sensing PD 42a, outputs a stop signal to the motor being driven. The motor that has received the stop signal stops rotating the rotating ball.

S18: As an alternative, each time the OEIC package 11 is inched, the prevailing coordinate or the coverage of distance to that point (the total number of revolutions of the motor driven) is stored in a table, and after the OEIC package is moved to a predetermined position (Xmax, Ymax), the OEIC package is returned to a position where the maximum output can be produced.

Upon complete registration between the positioning LD 41a and the sensing PD 42a, the operation is performed for optically coupling the positioning LD 41b and the sensing PD 42b. A method of this operation will be explained below.

The OEIC package 11 located at the coordinate (Xj, Yj) is rotated according to the steps described in Steps S19 to S28 below and a coordinate is searched for where the maximum output can be produced from the sensing PD 42b.

S19: The control circuit 93 drives only the motor 92c and thereby rotates the OEIC package 11 in counterclockwise direction by θ1 about the coordinate point (Xp, Yp) of the sensing PD 42b. In this case, the positioning unit 81 is designed, when placed on the printed board 1 with the terminals 83 inserted in the connector sockets 3, to locate the coordinate point (Xp, Yp) just under the rotating ball 82.

S20: The control circuit 93 drives only the motor 92c, and rotates the OEIC package 11 clockwise by θ1+θ2 about the coordinate point (Xp, Yp) of the sensing PD 42a.

The angles θ and θ2 are maximum movable angles in each direction of rotation and assume a value not more than about one to two degrees.

S17': While the OEIC package 11 is moving, the output level of the sensing PD 42a is monitored by the control circuit 93. The control circuit 93, upon detection that a signal exceeding a preset level is output from the sensing PD 42a, outputs a stop signal to the motor being driven. The motor that has received the stop signal stops driving the rotating ball.

S18': As an alternative, each time the OEIC package 11 is inched, the prevailing coordinate or the coverage of distance up to that point (the total number of revolutions of the motor driven) is stored in a table, and after rotating the OEIC package to a predetermined angle (θ=θ2), the OEIC package can be returned to the position associated with the maximum output.

The OEIC package and the printed board are designed in such a manner that when the positioning LDs 41a and 41b are set in position by the sensing PDs 42a and 42b, respectively, each element constituting the optical device array 12 is set in registration with a corresponding return waveguide 44. Upon complete registration, the control circuit 93 outputs a positioning-over signal to the discharge unit 94. In response to the positioning-over signal, the discharge unit 94 discharges hot air (in the case where the adhesive is a thermosetting resin) or ultraviolet light (in the case where the adhesive is an ultraviolet light-setting resin) toward the printed board.

Now, an explanation will be given of a method of setting the OEIC package of FIG. 6d in position on the printed board using the positioning unit 81. In the case under consideration, assume that the positioning unit 81 is in contact with the OEIC package and is controlled by a rotating ball 84 different from the rotating ball 82 and the control circuit 93, and includes a motor 95 for driving the rotating ball 84 in the direction of θ.

The OEIC package ii is placed at a predetermined position (X0, Y0) of the X-Y coordinates defined on the printed board. Each coordinate on the printed board is stored in a robot, so that the OEIC package 11 is conveyed by the robot to point (X0, Y0). The positioning unit 81, on the other hand, moves the OEIC package 11 according to the steps of steps 21 to 29 described below, and searches for the orientation of the OEIC package in which the maximum output can be produced from the sensing PD 42a.

Figure 16:
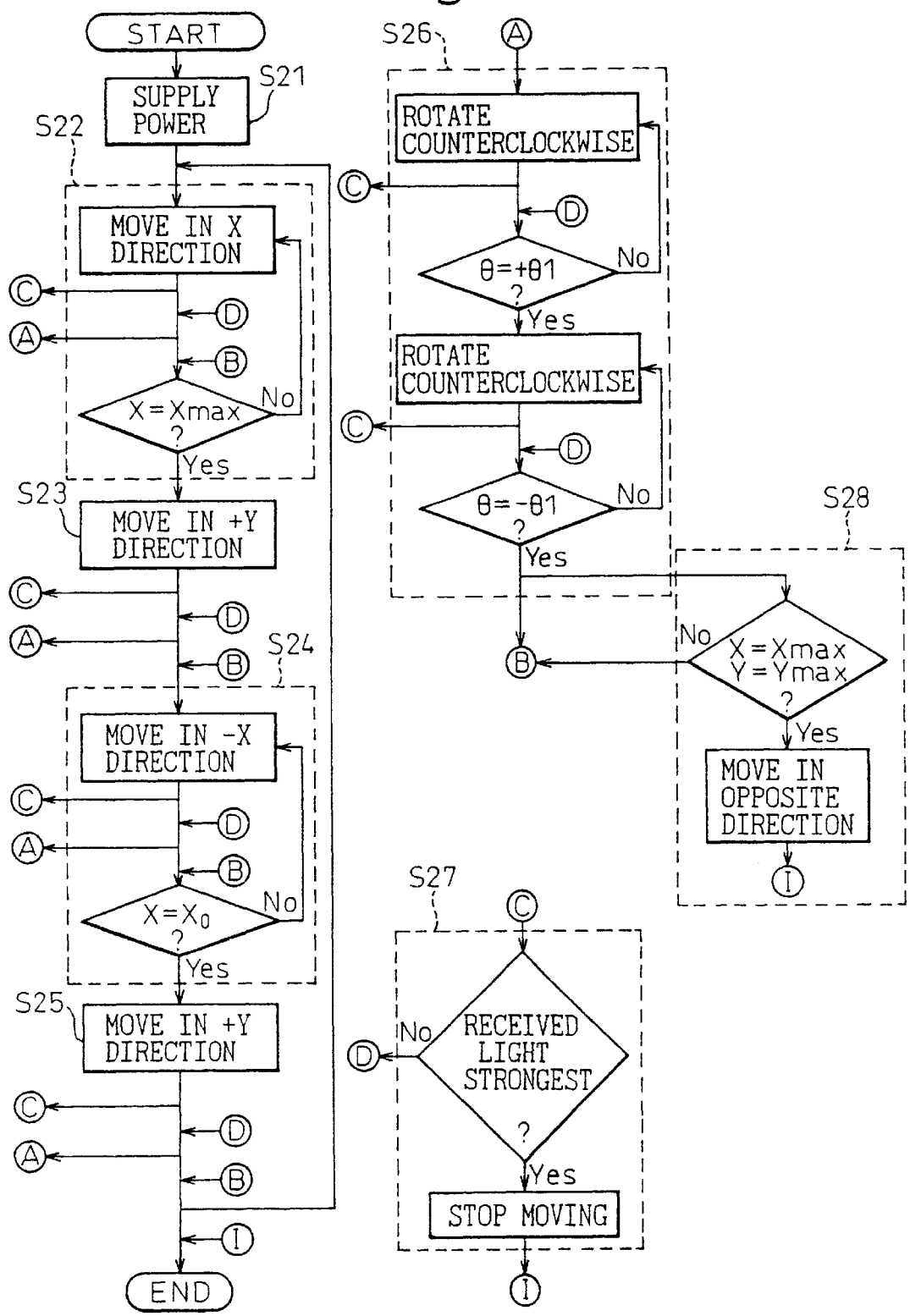
FIG. 16 is a second flowchart for registration.

FIG. 16 is a control flowchart for the positioning unit 81. Steps S21 to S29 shown in FIG. 16 will be explained below.

S21: Power is supplied from the power supply unit 91 to the positioning LDs, the sensing LDs and the function blocks in the positioning unit 81.

S22: The control circuit 93 drives only the motor 92a, so that the OEIC package 11 is moved by a minute distance Xs each time in the direction parallel to X axis to the farthest end of the movable range. The X coordinate at the farthest end point is assumed as Xmax. The control circuit 93 stores the number of revolutions of the motor required for moving the OEIC package 11 to Xmax.

S23: The control circuit 93 drives the motor 92b alone and moves the OEIC package 11 in parallel by the distance Y1, a minute distance Ys at a time. The control circuit 69 stores the number of revolutions of the motor required for moving the OEIC package 11 by the distance Ys.

S24: The control circuit 93 drives only the motor 92a, and moves the OEIC package 11, a minute distance Xs each time, in parallel to X axis until the X coordinate becomes X0.

S25: The control circuit 93 drives only the motor 92b, and moves the OEIC package 11, a minute distance Ys each time, along Y axis by Y1.

S26: In each of Steps S21 to S25 above, the control circuit 93 first drives only the motor 93b, and each time the OEIC package 11 is moved by Xs or Ys, rotates the OEIC package 11 by ±θ1 about the coordinate point (Xo, Yo) at the discharge port of the return waveguide 44. The control circuit 63 has stored therein the number of revolutions of the motor required for rotating by the angle θ1. Also, in the case under consideration, the positioning unit 81 is designed, when placed on the printed board 1 with the terminals 81 inserted in the connector socket 3, to locate the point (Xo, Yo) just under the rotating ball 82.

Next, only the motor 95 is driven, so that the OEIC package 11 is rotated by ±θ1 about the coordinate (Xi, Yi) at the entrance port of the return waveguide 44. The control circuit 93 stores the number of revolutions of the motor required for rotating by angle θ1. Also, in this case, the positioning unit 81 is designed, when placed on the printed board 1 with the terminals 83 inserted in the connector socket 3, to locate the point (Xi, Yi) just under the rotating ball 84.

S27: While the OEIC package 11 is moving, the output level of the sensing PD 42a is monitored by the detection circuit 93. The detection circuit 93, upon detection that a signal exceeding a preset level is output from the sensing PD 42a, outputs a signal to stop the motor being driven. The motor that has received the stop signal stops the rotation of the rotating ball.

S28: As an alternative, each time the OEIC package is moved by a minute angle or by a minute distance, the coordinate involved or the distance covered by the OEIC package (total number of revolutions of the motors) and the output of the sensing PD 42a are stored in a table. After the OEIC package has been moved to a predetermined range, the OEIC package can be returned to the position where the maximum output can be produced.

The OEIC package and the printed board are so designed that when the positioning LD 41a and the sensing PD 42a are set in registry with the inlet and the outlet of the waveguide, respectively, the elements making up the optical device array 12 are set in registry with the corresponding outlets of the return waveguide 44. Upon complete registration, the control circuit 93 outputs a positioning-over signal to the discharge unit 94. The discharge unit 94, in response to the positioning-over signal, discharges hot air (in the case where the adhesive is a thermosetting resin) or ultraviolet light (in the case where the adhesive is an ultraviolet light-setting resin) toward the printed board.

Figure 17A:
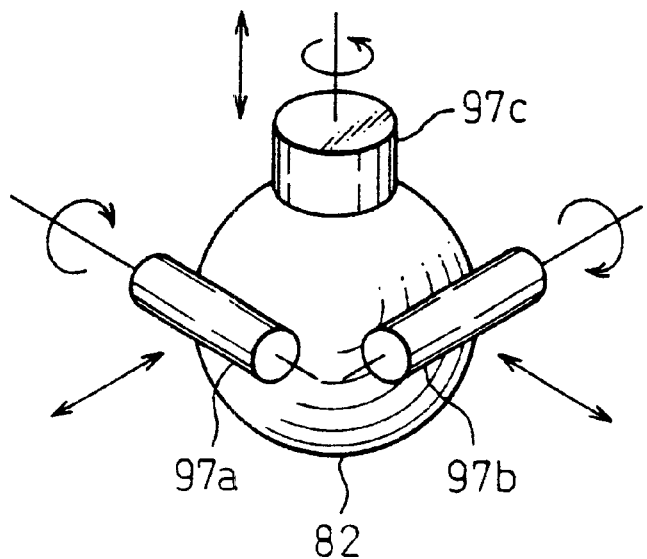
FIGS. 17a and 17b are views showing the structure of a rotating ball.
Figure 17B:
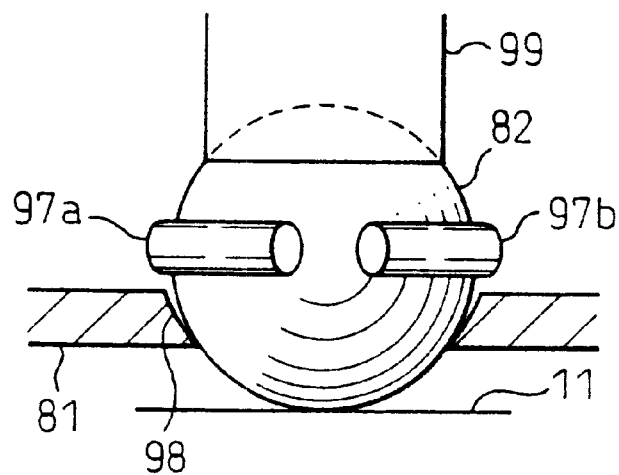
Figure 18A:
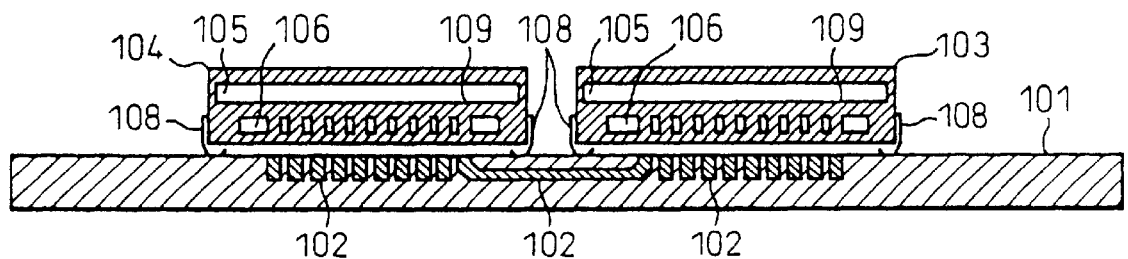
FIGS. 18a, 18b, and 18c are views showing the prior art.
Figure 18B:
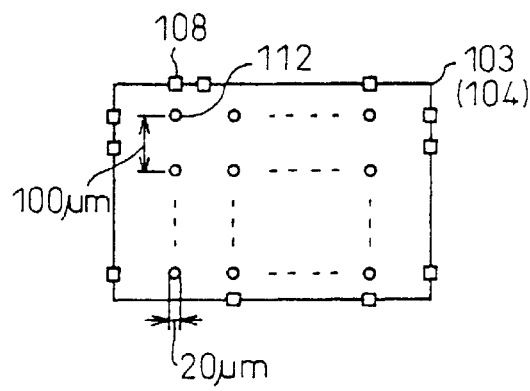
Figure 18C:
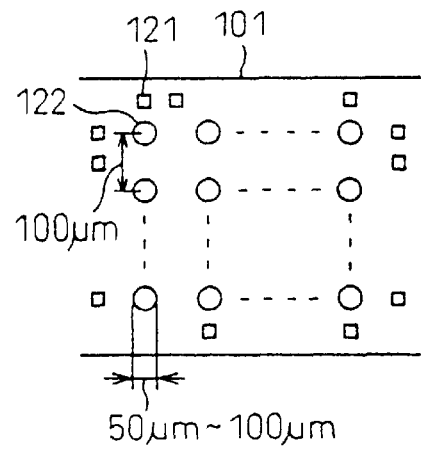

With reference to FIGS. 17a and 17b, the structure of the rotating ball 82 will be explained.

In FIG. 17a, numerals 97a, 97b, 97c designate rollers. The roller 97a is driven by a motor 92a thereby to move the rotating ball along the X axis. The roller 97b is driven by a motor 92b thereby to move the rotating ball along the Y axis. The roller 97c is driven by a motor 92c thereby to rotate the rotating ball in the direction θ. Each roller is adapted to contact or leave the rotating ball freely. A roller under the control of the motor stopped leaves the rotating ball, while the roller under the motor being driven contacts the rotating ball. There is no rotating ball 85 corresponding to the roller 97a or 97b, but a roller (corresponding to 97c) is provided which is driven by the motor 95 for rotating the rotating ball 85 in the direction of angle θ.

FIG. 17b is a side view showing a rotating ball. 98 designates an opening of the positioning unit, and 99 a fixed cylinder. The opening 98 is arranged on the bottom surface of the positioning unit 81 and is a small circular hole having a diameter smaller than that of the rotating ball 82. The rotating ball is placed on the opening 98 and partly exposed under the positioning unit. The fixed cylinder 99 is arranged on the rotating ball 82 which in turn is placed on the opening 98, so that part of the rotating ball is covered by the fixed cylinder 99. The opening 98 and the fixed cylinder 99 prevent the rotating ball from rolling.

The embodiments described above are intended for application to the semiconductor parts mounted on a printed board and an OEIC package. The invention, however, is also applicable to a multi-chip module in which a plurality of chips are arranged on a ceramic board.

According to this invention, a connector socket for receiving semiconductor parts having photoelectric elements is installed on a printed board. By arranging the semiconductor elements in the connector socket, the correct position for the semiconductor parts can be checked within a defined range, and therefore the working efficiency is improved. Also, the degree of optical coupling is checked by optical communication between the printed board and the semiconductor parts mounted thereon. As a result, relative positions of two distant objects can be determined, and the correct position of the semiconductor parts arranged on the printed board can be checked. Further, since the semiconductor parts with an optical device mounted thereon are fixed on a printed board using an adhesive, the soldering, which exerts thermal stress, is eliminated, thereby securing the safety of the parts.

It is to be understood that the invention is by no means limited to the specific embodiments illustrated and described herein, and that various modifications thereof may be made which come within the scope of the present invention as defined in the appended claims.

What is claimed is:

1. A socket installed on a printed board having an optical device, for positioning of a semiconductor part which has a photoelectric element and a terminal, the socket installed with the photoelectric element of the semiconductor part arranged to optically communicate with the optical device of the printed board, the socket comprising:

a base;

exterior walls extending from the base to form a space for receipt of the semiconductor part; and a socket terminal for connection to the terminal of the semiconductor part.

2. The socket as defined in claim 1, wherein said socket terminal is an electric terminal and the terminal of the semiconductor communicates with the socket terminal upon insertion of the semiconductor part into the space of the socket.

3. The socket as defined in claim 1, wherein after insertion of the semiconductor part into the socket, a gap exists between the semiconductor part and the exterior walls of the socket so that the socket is usable for a rough positioning and subsequent accurate positioning is carried out within the region of said gap.

* * * * *